US007396635B2

(12) United States Patent  (10) Patent No.: US 7,396,635 B2
Naito  (45) Date of Patent: *Jul. 8, 2008

(54) PRODUCING METHOD OF WIRED CIRCUIT BOARD

(75) Inventor: Toshiki Naito, Osaka (JP)

(73) Assignee: Nitto Denko Corporation, Osaka (JP)

( * ) Notice: Subject to any disclaimer, the term of this patent is extended or adjusted under 35 U.S.C. 154(b) by 160 days.

This patent is subject to a terminal disclaimer.

(21) Appl. No.: 11/236,823

(22) Filed: Sep. 28, 2005

(65) Prior Publication Data

US 2006/0076242 A1   Apr. 13, 2006

(30) Foreign Application Priority Data

Oct. 13, 2004  (JP)  .............................. 2004-299254

(51) Int. Cl.
G03F 7/00 (2006.01)
(52) U.S. Cl. ..................... 430/311; 430/319; 430/320
(58) Field of Classification Search ................ 430/319, 430/311, 320; 428/77, 101, 78, 98
See application file for complete search history.

(56) References Cited

U.S. PATENT DOCUMENTS

| 3,832,176 | A | | 8/1974 | Neubert et al. |
| 4,806,409 | A | | 2/1989 | Walter et al. |
| 4,980,034 | A | | 12/1990 | Volfson et al. |
| 5,567,328 | A | | 10/1996 | Engle et al. |
| 5,837,380 | A | * | 11/1998 | Choi et al. ................. 428/480 |
| 5,972,152 | A | | 10/1999 | Lake et al. |
| 6,057,174 | A | | 5/2000 | Hashimoto |
| 6,210,518 | B1 | | 4/2001 | Lee et al. |
| 6,309,805 | B1 | | 10/2001 | Carpenter |

(Continued)

FOREIGN PATENT DOCUMENTS

EP   1 519 640 A1   3/2005

(Continued)

*Primary Examiner*—Mark F. Huff
*Assistant Examiner*—Caleen O Sullivan
(74) *Attorney, Agent, or Firm*—Jean C. Edwards, Esq.; Akerman Senterfitt (57) ABSTRACT

A producing method of a wired circuit board that can prevent meandering of the elongate base material conveyed with the rolls and also prevent entry of air bubbles in between a light-transparency protecting film and a photosensitive solder resist layer when the light-transparency protecting film is laminated on the photosensitive solder resist layer. After a conductive pattern 3 is formed on the front side of the elongate base material 1 by the additive process, a narrow stiffener sheet 7 smaller in width than the elongate base material 1 is provided on the back side of the elongate base material 1. Then, after the photosensitive solder resist layer 10 is formed on the front side of the elongate base material 1 to cover the conductive pattern 3, the light-transparency protecting film 11 is laminated on the front side of the photosensitive solder resist layer 10. Thereafter, the photosensitive solder resist layer 10 is exposed to light through the light-transparency protecting film 11. Then, after the light-transparency protecting film 11 is stripped off from the photosensitive solder resist layer 10, the photosensitive solder resist layer 10 was developed and then cured by heating. Thereafter, the narrow stiffener sheet 7 is stripped off from the elongate base material. The flexible wired circuit board is produced in the manner described above.

5 Claims, 4 Drawing Sheets

U.S. PATENT DOCUMENTS

| | | |
|---|---|---|
| 6,702,916 B2 | 3/2004 | Smith |
| 2005/0053868 A1* | 3/2005 | Naito .................. 430/311 |
| 2005/0067293 A1* | 3/2005 | Naito et al. ............. 205/125 |
| 2006/0076242 A1 | 4/2006 | Naito |

FOREIGN PATENT DOCUMENTS

| | | | |
|---|---|---|---|
| EP | 1519640 | * | 3/2005 |
| JP | 6-132628 | | 5/1994 |
| JP | HEI 6-132628 | | 5/1994 |
| JP | 9-136378 | | 5/1997 |
| JP | 2002-299385 | | 10/2002 |
| JP | 2004-079844 | * | 3/2004 |
| JP | 2004-79844 | | 3/2004 |

* cited by examiner

PRODUCING METHOD OF WIRED CIRCUIT BOARD

BACKGROUND OF THE INVENTION

1. Field of the Invention

This application claims priority from Japanese Patent Appln. No. 2004-299254, filed Oct. 13, 2004, the contents of which are herein incorporated by reference in their entirety.

The present invention relates to a producing method of a wired circuit board and, more particularly, to a method of producing a wired circuit board while conveying an elongate base material using rolls.

2. Description of the Prior Art

As is known, the roll-to-roll process is used for forming a conductive pattern and the like on a surface of elongate base material while conveying the elongate base material by using rolls, in order to provide an improved production efficiency of the wired circuit board.

Along with the trend toward lighter, thinner, and more compact electronic components, the trend in wired circuit boards is also toward thinner profile. A thin, elongate, base material is however creased or get wrinkled when conveyed using rolls. Prior art proposes an attempt solution to prevent this that a carrier film is adhesively bonded to a surface of a thin, copper clad laminate (e.g. JP Laid-open (Unexamined) Patent Publication No. Hei 6-132628).

Also, prior art proposes improvement of the process of coating a photosensitive solder resist using a roll coater, to prevent adhesion of foreign matter to a surface of the photosensitive solder resist. In the improvement, after the resist layer is dried to volatilize solvent components of the resist layer, a light-transparency protecting film is laminated on the resist layer and a solder resist pattern is provided on the surface of the protecting film. Then, after the resulting resist layer is exposed to light, the protecting film is removed from the resist layer and the resist layer is developed (e.g. JP Laid-open (Unexamined) Patent Publication No. 2004-79844).

Meanwhile, along with improvements in fine conductive pattern in recent years, the additive process of forming a conductive pattern by electrolytic plating is in widespread use. However, when the conductive pattern is formed on the base material by the electrolytic plating, the following problems occur. In general, in the electrolytic plating, a current density becomes higher at both widthwise end portions of the elongate base material than at a widthwise central portion of the same. Due to this, deposition of the electrolytic plating is promoted at the both widthwise end portions of the elongate base material, so that thickness of the conductive pattern plated is apt to become larger at the both widthwise end portions of the elongate base material than at the widthwise central portion of the same.

When this elongate base material is coated with the photosensitive solder resist to cover the conductive pattern by the roll coater, the conductive pattern formed to have a larger thickness at the both widthwise end portions of the elongate base material is brought into contact with the roll coater, to cause meander of the elongate base material conveyed with the rollers disadvantageously.

Also, when the protecting film is laminated on the surface of the photosensitive solder resist, the elongate base material and protecting film is conveyed while being held in sandwich relation between a pair of upper and lower nip rollers and being pressurized by the nip rollers. When the conductive pattern has a larger thickness at the both widthwise end portions of the elongate base material than at the widthwise central portion of the same, the pressure cannot be uniformly applied on the elongate base material including portions thereof close to the both ends thereof, to cause entry of air bubbles in between the photosensitive solder resist and the protecting film. This will cause scattering of light in the subsequent exposure process, and as such can cause production of pinholes in the subsequent development process disadvantageously.

SUMMARY OF THE INVENTION

It is an object of the present invention to provide a producing method of a wired circuit board that can prevent meandering of the elongate base material conveyed with the rolls and also prevent entry of air bubbles in between a light-transparency protecting film and a photosensitive solder resist layer when the light-transparency protecting film is laminated on the photosensitive solder resist layer.

To accomplish the object mentioned above, the present invention provides a producing method of a wired circuit board comprising the process of forming a conductive pattern on a surface of an elongate base material by electrolytic plating, the process of providing a stiffener sheet having a width narrower than the elongate base material on a back side of the elongate base material on its side opposite to the side where the conductive pattern is formed, and the process of forming a photosensitive solder resist layer on a surface of the elongate base material to cover the conductive pattern.

According to this method, even when the conductive pattern is formed by electrolytic plating on the elongate base material to have a larger thickness at both widthwise end portions of the elongate base material than at a widthwise central portion of the same, since the stiffener sheet provided on the elongate base material is formed to have a width narrower than the elongate base material, the elongate base material can be bent flexibly at the both widthwise end portions thereof. This can provide the result that when the photosensitive solder resist layer is formed on the front side of the elongate base material, the both widthwise end portions of the elongate base material can be bent flexibly to allow the photosensitive solder resist layer to be away from coating means for the photosensitive solder resist. This can prevent the conductive pattern having partly the larger thickness from contacting with the coating means for the photosensitive solder resist. This can ensure reliable conveyance of the elongate base material even when the photosensitive solder resist layer is coated over the surface of the elongate base material while the elongate base material is conveyed with rolls.

It is preferable that the producing method of the wired circuit board of the present invention further comprises the process of laminating a light-transparency protecting film on a surface of the photosensitive solder resist layer, and the process of exposing the photosensitive solder resist layer to light through the light-transparency protecting film.

When the light-transparency protecting film is laminated on the surface of the photosensitive solder resist and then the photosensitive solder resist is exposed to light through the light-transparency protecting film, there can be provided the result that even when the surface of the photosensitive solder resist layer has tackiness, the elongate base material can be rolled up without being stuck together, while the photosensitive solder resist layer can be exposed to light through the light-transparency protecting film.

Besides, even when the conductive pattern is formed to have a larger thickness at the both widthwise end portions of the elongate base material than at the widthwise central portion of the same, the light-transparency protecting film can be laminated on the surface of the photosensitive solder resist with uniform pressure by bending the both widthwise end portions of the elongate base material flexibly to allow the photosensitive solder resist layer to be away from the laminating means for the light-transparency protecting film. This can prevent entry of air bubbles in between the photosensitive solder resist layer and the light-transparency protecting film. This can suppress scattering of light in the subsequent exposure process, and as such can prevent production of pinholes in the subsequent development process.

BRIEF DESCRIPTION OF THE DRAWINGS

In the drawings:

FIG. 1 is a production process drawing showing an embodiment of a producing method of a wired circuit board of the present invention, (a) showing the process of preparing an elongate base material, (b) showing the process of forming a thin metal film on the entire surface of the elongate base material, (c) showing the process of forming on the thin metal film a plating resist of a reverse pattern to a conductive pattern, (d) shows the process of forming the conductive pattern by electrolytic plating on the thin metal film exposed from the plating resist, (e) showing the process of removing the plating resist, (f) showing the process of removing the thin metal film exposed from the conductive pattern, (g) showing the process of providing a narrow stiffener sheet on a back side of the elongate base material, (h) showing the process of forming a solder resist layer on a front side of the elongate base material, and (i) showing the process of removing the narrow stiffener sheet.

DETAILED DESCRIPTION OF THE PREFERRED EMBODIMENT

Figure 1:
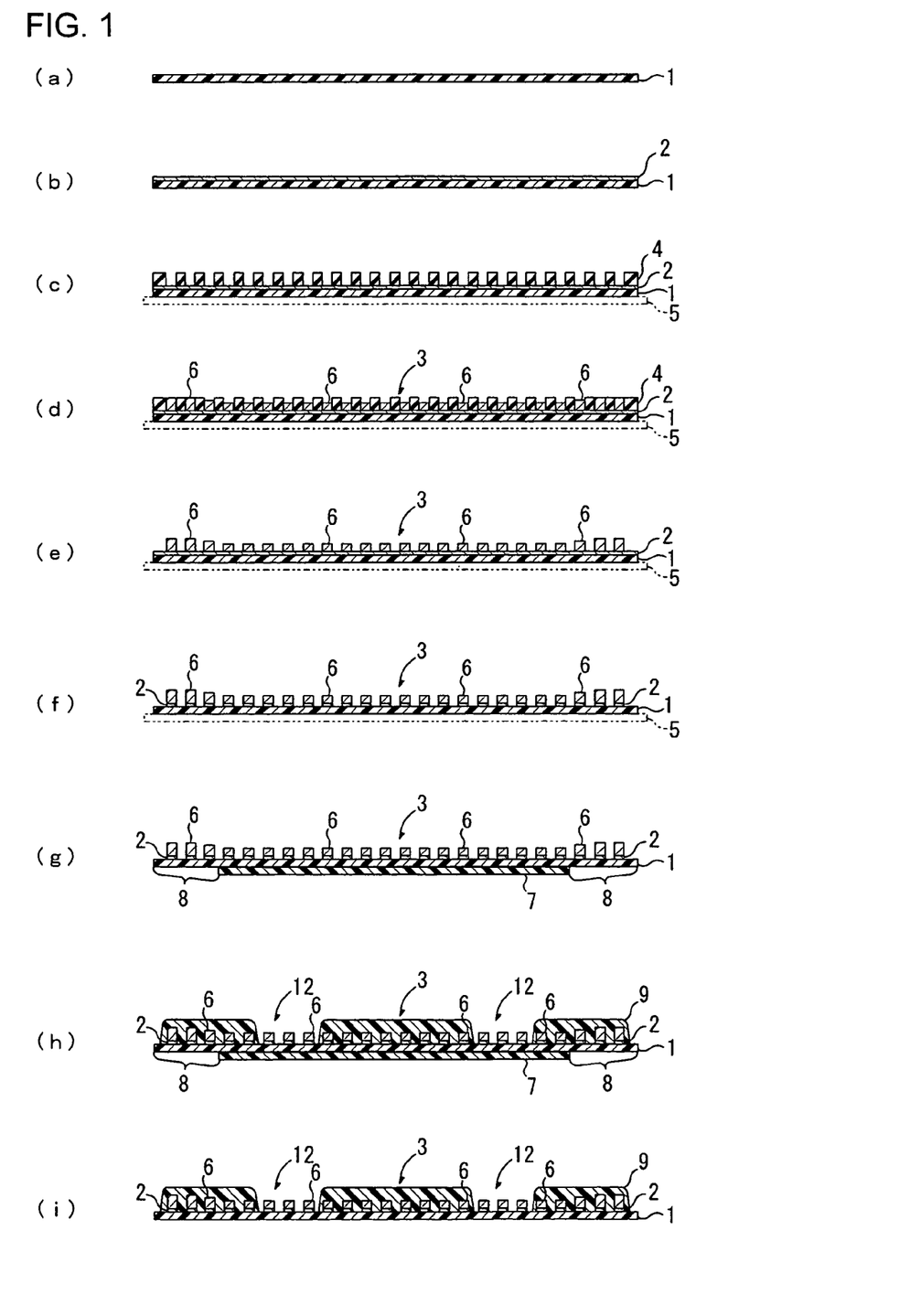
Figure 2:
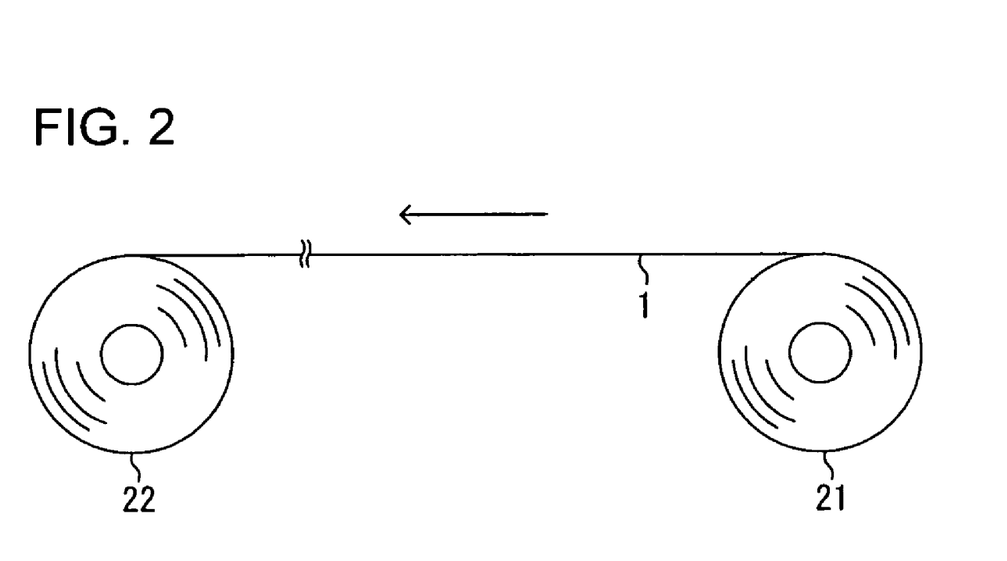
FIG. 2 is a block schematic diagram of manufacturing equipment used for the producing method of the wired circuit board shown in FIG. 1.

FIG. 1 is a production process drawing showing an embodiment of a producing method of a wired circuit board of the present invention, and FIG. 2 is a block schematic diagram of manufacturing equipment used for conveying out the embodiment.

In FIG. 2, the manufacturing equipment is used for producing a wired circuit board using a roll-to-roll process and is equipped with a delivery roll 21 and a take-up roll 22 which are spaced apart at a predetermined distance from each other.

In the roll-to-roll process, for example, an elongate base material 1 rolled on the delivery roll 21 is delivered toward the take-up roll 22 and is taken up by the take-up roll 22 in each of the processes, as mentioned later. In process of this roll conveying (delivery and rewinding), the processes shown in FIG. 1 are taken in sequence. The take-up roll 22 on which the elongate base material is taken up can be used as the delivery roll 21 in the next process.

In the following, a method of producing a flexible wired circuit board as a wired circuit board in the roll-to-roll process using this manufacturing equipment is explained with reference to FIG. 1.

In this method, the elongate base material 1 is prepared, first, as shown in FIG. 1(a). The elongate base material 1 is the one used for forming an insulating base layer of a flexible wired circuit board. Any particular limitation is imposed on the material for the elongate base material, as long as it may be used for the insulating base layer. For example, resins in sheet form (resin films), such as polyimide, acryl, polyether nitrile, polyether sulfone, polyethylene terephthalate, polyethylene naphthalate, and polyvinyl chloride, may be used. Preferably, polyimide sheet is used.

The elongate base material 1 preferably has a thickness of 5-50 μm, or preferably 10-30 μm. Using the elongate base material 1 having thickness in this order can produce a thinner-profile flexible wired circuit board. The elongate base material 1 is in a tape-like form having a width of e.g. 100-500 mm, or preferably 150-350 mm, and a length of e.g. 10-1,500 m, or preferably 100-300 m, and is prepared in the state of being roll up on the delivery roll 21.

Then, in order to form a conductive pattern 3 finely by the additive process, a thin metal film 2 is formed on the entire surface of the elongate base material 1, as shown in FIG. 1(b). No particular limitation is imposed on the process of forming the thin metal film 2. For example, a vacuum deposition process and a sputtering process can be used to form the thin metal film 2. Preferably, the sputtering process is used for forming the thin metal film 2. Also, chromium and copper are preferably used as the metal for forming the thin metal film 2.

To be more specific, a thin chrome film and a thin copper film are formed in sequence on the entire surface of the elongate base layer 1 by the sputtering process. The metal film 2 is formed so that the thin chrome film can have thickness of e.g. 5-50 nm and the thin copper film can have thickness of e.g. 50-500 nm. In this thin metal film 2 forming process, large load is not usually applied on the elongate base material 1, so there is no need to adhesively bond a wide stiffener sheet 5 mentioned later to the elongate base material 1 in this stage.

Then, a plating resist 4 of a reverse pattern to the conductive pattern 3 is formed on the thin metal film 2, as shown in FIG. 1(c). The plating resist 4 of reverse pattern to the conductive pattern 3 is formed on the thin metal film 2, for example, by a known method that a photosensitive dry film resist is bonded on the thin metal film 2 or by a known patterning method that liquid photoresist is applied thereto and dried, and then the resultant film is exposed to light and developed.

It should be noted that in the process of forming the plating resist 4 and the subsequent process of forming the conductive pattern 3 as mentioned next, a wide stiffener sheet 5 is preferably provided on the elongate base material 1.

The wide stiffener sheet 5 is bonded to the back side of the elongate base material 1 or on the side thereof opposite to the side where the plating resist 4 is formed. The wide stiffener sheet 5 can be provided on the elongate base material in such a manner that the same resin sheet (resin film) as the one mentioned above is bonded to the elongate base material 1 via adhesive. Alternatively, the same photosensitive dry film resist as the one mentioned above may be bonded to or the liquid resist mentioned above may applied to the elongate base material 1 and dried in the same manner as above (except that the resultant film is exposed to light and developed).

Preferably, the wide stiffener sheet 5 has a thickness of e.g. 20-200 μm or preferably 50-150 μm, and a width equal to or larger than the elongate base material 1, for example.

Thereafter, the conductor layer 3 is formed on an area of the thin metal film 2 exposed from the plating resist 4 by electrolytic plating, as shown in FIG. 1(*d*). Any conductive material may be used for forming the conductive pattern 3 without any particular limitation, as long as it can be plated by electrolytic plating. For example, copper, nickel, gold, solder, or alloys thereof may be used. Preferably, copper is used. The conductive pattern 3 has a thickness of e.g. 5-20 μm, or preferably 8-12 μm, at a widthwise center portion thereof as mentioned later. Also, the conductive pattern is formed in a fine wired circuit pattern formed by a plurality of lines of wire 6 extending along a longitudinal direction of the elongate base material 1 and spaced in parallel with each other at a predetermined interval. Each line of wire 6 usually has a width of 5-50 μm and an interval between adjacent lines of wire 6 is usually set to be 5-50 μm.

To be more specific, after the formation of the plating resist 4, this conductive pattern 3 is formed by electrolytic plating, or preferably by electrolytic copper plating, while the elongate base material 1 passes through a plating bath (not shown) continuously between the delivery roll 21 and the take-up roll 22.

In this electrolytic plating process, a current density becomes higher at both widthwise end portions of the elongate base material 1 (in a direction perpendicular to the longitudinal direction of the elongate base material 1) than at the widthwise central portion of the same. Due to this, deposition of the electrolytic plating is promoted at the both widthwise end portions of the elongate base material, so that thickness of the conductive pattern 3 plated becomes larger at the both widthwise end portions of the elongate base material 1 than at the widthwise central portion of the same. To be more specific, letting the thickness of the widthwise central portion of the lines of wire 6 of the conductive pattern 3 be 100%, the thickness of the both widthwise end portions of the same becomes 105-150%.

Then, the plating resist 4 is removed by a known etching process, such as a chemical etching (wet etching), or by stripping, as shown in FIG. 1(*e*). Thereafter, the thin metal film 2 exposed from the conductive pattern 3 is also removed by the known etching process such as the chemical etching (wet etching), as shown in FIG. 1(*f*).

Then, if the wide stiffener sheet 5 is provided on the elongate base material 1, then the wide stiffener sheet 5 is also stripped from the elongate base material 1. Thereafter, a narrow stiffener sheet 7 having a width narrower than the elongate base material 1, which serves as a stiffener sheet of the present invention, is provided on the back side of the elongate base material 1 on a side thereof opposite to the front side where the conductive pattern 3 is formed, as shown in FIG. 1(*g*).

The narrow stiffener sheet 7 is formed, for example, from the same resin sheet (resin film) as above, or preferably from a polyethylene terephthalate film. The resin sheet having a width of e.g. 90-498 mm, or preferably 145-345 mm, is used as the narrow stiffener sheet 7. Letting the width of the elongate base material 1 be 100%, the width of the narrow stiffener sheet 7 is preferably in the range of 90.0% to 99.6%, or preferably in the range of 96.7% to 98.6%.

Preferably, the narrow stiffener sheet 7 has a thickness of e.g. 20-200 μm, or preferably 50-150 μm.

The narrow stiffener sheet 7 is provided on the elongate base material 1 by bonding the narrow stiffener sheet 7 to the back side of the elongate base material 1 via known adhesive, for example. To be more specific, the narrow stiffener sheet 7 is adhesively bonded to the elongate base material 1 in such a manner as to allow margins 8 at the both widthwise end portions of the elongate base material 1, so as not to overlap with the both widthwise end portions of the elongate base material 1 where the thick lines of wire 6 are formed. The margins 8 are preferably set to have a width of 1-10 mm, or preferably 2-5 mm. As a result of this, the narrow stiffener sheet 7 are provided on the elongate base material 1, with its both edges placed 1-10 mm, or preferably 2-5 mm, inwardly from the both widthwise ends of the elongate base material 1.

Then, a solder resist layer 9 is formed on the surface of the elongate base material 1 in a predetermined form to cover the conductive pattern 3, as shown in FIG. 1(*h*).

Figure 3:
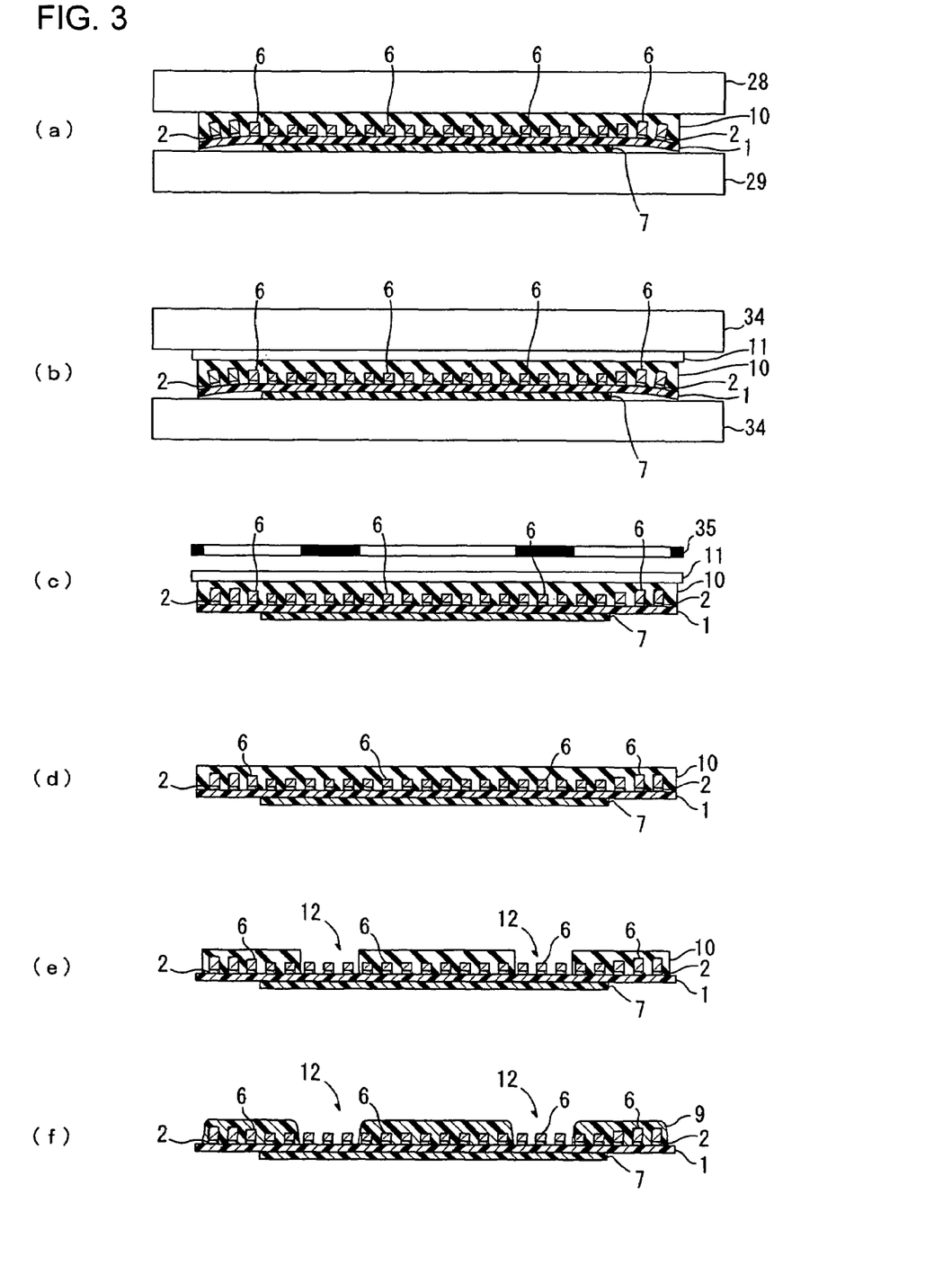
FIG. 3 is a production process drawing for forming the solder resist layer, (a) showing the process of forming the photosensitive solder resist layer, (b) showing the process of laminating a light-transparency protecting film on the front side of the photosensitive solder resist layer, (c) showing the process of exposing to light the photosensitive solder resist layer on which the light-transparency protecting film is laminated, (d) showing the process of removing the light-transparency protecting film, (e) showing the process of developing the photosensitive solder resist layer, and (f) showing the process of curing the photosensitive solder resist layer by heating.
Figure 4:
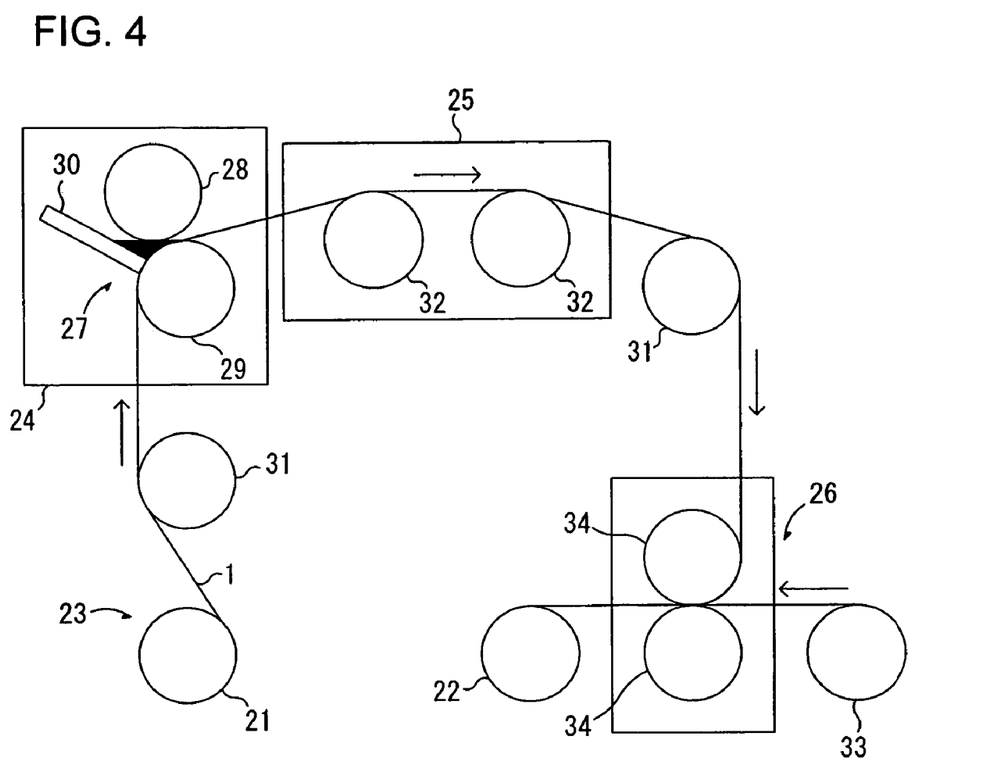
FIG. 4 is a concrete block schematic diagram of the manufacturing equipment of FIG. 2 used for the processes from FIG. 3(a) to FIG. 3(b).

FIG. 3 is a production process drawing for forming the solder resist layer 9, and FIG. 4 is a concrete block schematic diagram of the manufacturing equipment shown in FIG. 2 used for the processes from FIG. 3(*a*) to FIG. 3(*b*).

In the following, the process of forming the solder resist layer 9 on the surface of the elongate base material 1 to cover the conductive pattern 3 is explained in detail with reference to FIGS. 3 and 4.

In FIG. 4, the manufacturing equipment is equipped with a delivery section 23, a coating section 24, a drying section 25, and a protecting film laminating section 26, which are sequentially arranged along a conveying direction of the elongate base material 1 (the terminology "conveying direction" means "the direction for the elongate base material 1 to be conveyed", unless otherwise specified in the specification).

The delivery roll 21 is placed in the delivery section 23.

The coating section 24 is arranged at a location downstream of the conveying direction with respect to the delivery section 23, and a roll coater 27 is placed in the coating section 24. The roll coater 27 includes a coater head roll 28 and a backup roll 29, which are spaced to provide a conveying passage of the elongate base material 1 in between them to allow the elongate base material 1 to pass through therebetween, and a varnish supply blade 30, arranged at a location upstream of the conveying direction with respect to the coater head roll 28 and the backup roll 29, for supplying varnish of photosensitive solder resist to the elongate base material 1.

The space between the coater head roll 28 and the backup roll 29 is set to be e.g. 50-400 μm, or preferably 90-300 μm.

The roll coater 27 serves to supply the varnish of the photosensitive solder resist to the surface of the elongate base material 1 passing through between the coater head roll 28 and the backup roll 29 under a guidance of the varnish supply blade 30 so that the varnish can be continuously coated over the surface of the elongate base material 1 in a predetermined thickness by the coater head roll 28 and the backup roll 29 while the elongate base material 1 is conveyed.

The drying section 25 is arranged at a location downstream of the conveying direction with respect to the coating section 24 and includes a hot-air circulation type of drying passageway. Conveying rolls 32 are properly arranged in the drying furnace.

The protecting film laminating section 26 is arranged at a location downstream of the conveying direction with respect to the drying section 25 and includes a protecting film delivery roll 33 and a pair of nip rolls 34. A take-up roll 22 is placed at the protecting film laminating section 26.

The protecting film delivery roll 33 and the take-up roll 22 are spaced apart from each other, between which a pair of nip rolls 34 are disposed to confront each other in a cross direction orthogonal to a conveying direction for a light-transparency protecting film 11 to be conveyed from the protecting film delivering roll 33 to the take-up roll 22.

In the protecting film laminating section 26, the light-transparency protecting film 11 is rolled up on the protecting film delivery roll 33 and is delivered therefrom toward the take-up roll 22. The pair of nip rolls 34 are arranged partway along the conveying way of the light-transparency protecting film 11, and the elongate base material 1 after passing past the drying section 25 is conveyed in between the nip rolls 34. As a result of this, the light-transparency protecting film 11 delivered from the protecting film delivering roll 33 is laminated on the front side of the photosensitive solder resist 11 laminated on the elongate base material 1 on the way of the conveying way thereof via the pair of nip rolls 34. Then, the elongate base material 1 laminating the light-transparency protecting film 11 thereon is taken up on the take-up roll 22.

In this manufacturing equipment, tension rollers 31 are provided at locations between the delivery section 23 and the coating section 24 and between the drying section 25 and the protecting film laminating section 26, respectively, to apply adequate tensile force to the elongate base material 1 conveyed along the conveying path of the elongate base material 1.

Then, varnish of photosensitive solder resist is coated over the elongate base material 1 delivered from the delivery roll 21 placed in the delivery section 23 by using the roll coater 27 placed in the coating section 24, to form a photosensitive solder resist layer 10 on the elongate base material 1, first, as shown in FIG. 3(a).

No particular limitation is imposed on the photosensitive solder resist. Known photosensitive resins including, for example, polyimide, acryl, polyurethane, and epoxy resin, may be used. This photosensitive rein is dissolved in organic solvent and the resultant one is prescribed as the varnish.

The varnish is supplied to a space between the front side of the elongate base material 1 conveyed and the coater head roll 28 under the guidance of the varnish supply blade 30 while being supported by the backup roll 29. Although the lines of wire 6 of the conductive pattern 3 formed on the front side of the elongate base material 1 by electrolytic plating have larger thickness at the both widthwise end portions of the elongate base material 1 than at the widthwise center portion of the same, since the narrow stiffener sheet 7 provided on the elongate base material 1 is formed to have a width narrower than the elongate base material 1 so as to allow the margins 8 at the both end portions of the elongate base material 1, the elongate base material 1 can be bent flexibly at the both widthwise end portions thereof. This can provide the result that when the elongate base material 1 is coated with the varnish, the both widthwise end portions of the elongate base material 1 are flexibly bent by a pressing force from the coated varnish to escape away from the coater head roll 28. As a result, the lines of wire 6 formed to have larger thickness at the both widthwise end portions of the elongate base material 1 can be avoided contacting with the coater head roll 28. This can produce the result of preventing meandering of the elongate base material 1 conveyed by the rollers which is caused by such contact. This can ensure reliable conveyance of the elongate base material 1 even when the photosensitive solder resist layer 10 is formed by coating on the front side of the elongate base material 1 while the elongate base material is conveyed with rolls.

Then, the elongate base material 1 on which the photosensitive solder resist layer 10 was formed by coating is conveyed to the drying section 25 and is dried at about 60-120° C. in the drying section 25. By this drying process, the photosensitive solder resist layer 10 is retained in shape as a coating to the extent to which its tackiness (stick) remains on the surface. The photosensitive solder resist layer 10 after dried is set to have thickness of e.g. 3-50 μm, preferably 5-50 μm, or further preferably 8-20 μm.

Thereafter, the photosensitive solder resist layer 10 dried is conveyed to the protecting film laminating section 26 and the light-transparency protecting film 11 is laminated on the front side of the photosensitive solder resist layer 10 in the protecting film laminating section 26, as shown in FIG. 3(b).

Any film may be used as the light-transparency protecting film 11 without any particular limitation, as long as it can transmit light for exposure of the photosensitive solder resist layer 10 to light. Preferably, the film that can transmit 80% or more of the light with wavelengths of 100-800 nm, or preferably 350-450 nm, particularly the film that can transmit the i-ray (365 nm), the h-ray (405 nm), and the g-ray (436 nm) highly, is used as the light-transparency protecting film 11.

To be more specific, for example a polyethylene film and a polyester film may be used as the light-transparency protecting film 11. The polyethylene film having good flexibility is preferably used as the light-transparency protecting film 11 in that since it has good follow up properties with projections and depressions of the conductive pattern 3, it can be laminated on the elongate base material 1 easily. The use of this polyethylene film as the light-transparency protecting film 11 can prevent entry of air bubbles in between the light-transparency protecting film 11 and the elongate base material 1, and as such can prevent scattering of light in the subsequent exposure process effectively. In addition, the use of the polyester film can provide reduction in manufacturing costs.

The light-transparency protecting film 11 has a thickness of e.g. 5-50 μm, or preferably 10-30 μm.

Then, the light-transparency protecting film 11 is laminated on the front side of the photosensitive solder resist layer 10 laminated on the elongate base material 1 between the pair of nip rolls 34, while passing past the pair of nip rolls 34 and being conveyed toward the take-up roll 22. Thereafter, the elongate base material 1 laminating the light-transparency protecting film 11 thereon is taken up on the take-up roll 22.

Although the lines of wire 6 of the conductive pattern 3 formed on the front side of the elongate base material 1 by electrolytic plating have larger thickness at the both widthwise end portions of the elongate base material 1 than at the widthwise center portion of the same, since the both widthwise end portions of the elongate base material 1 are flexibly bent by a pressing force from the light-transparency protecting film 11 laminated to escape away from the nip roll 34 on the side that supports the light-transparency protecting film 11, the light-transparency protecting film 11 can be laminated on the elongate base material 1 with uniform pressure. This can provide the result of preventing entry of air bubbles in between the photosensitive solder resist layer 10 and the light-transparency protecting film 11, and as such can prevent scattering of light in the subsequent exposure process and thus generation of pinholes in the subsequent developing process.

Then, the photosensitive solder resist layer 10 laminating the light-transparency protecting film 11 thereon is exposed to light through a photomask 35, as shown in FIG. 3(c). The photomask 35 has light transmitting portions and light shielding portions which are arranged to correspond to a predetermined pattern to form the solder resist layer 9. The exposure wavelength is in the range of e.g. 100-800 nm, or preferably 350-450 nm, and the light exposure is in the range of e.g. 100-800 mJ/cm$^2$. The photosensitive solder resist layer 10 is exposed to light passing through the photomask 35 which can transmit the light selectively and in turn the light-transparency protecting film 11.

Thereafter, the light-transparency protecting film 11 is removed by stripping and the like, as shown in FIG. 3(d). Then, the photosensitive solder resist layer 10 is developed, as shown in FIG. 3(e). It is developed by a known developing process, such as dipping and spraying, using alkaline solution and the like as developing solution. The alkaline concentration of the developing solution is in the order of e.g. 0.3-5%, and the developing temperature is in the range of e.g. 20-60° C.

The photosensitive solder resist layer 10 is developed into a predetermined pattern by dissolving its portions corresponding to the terminals of the conductive pattern 3 by the development.

Then, the photosensitive solder resist layer 10 thus developed into a predetermined pattern is cured by heating to form the solder resist layer 9, as shown in FIG. 3(f). The solder resist layer 9 is formed in a predetermined pattern in which its portions corresponding to the terminals 12 of the conductive pattern 3 are opened. The heating temperature is in the order of e.g. 120-200° C. Also, the thickness of the solder resist layer 9 is in the range of e.g. 5-30 μm, or preferably 10-20 μm.

Thereafter, the narrow stiffener sheet 7 is removed by stripping and the like, as shown in FIG. 1(i). The flexible wired circuit board is obtained by the processes described above.

Additionally, a nickel plating layer and a gold plating layer may be properly formed on the terminals 12 by electroless plating.

When the flexible wired circuit board is produced in this manner, the following result can be provided. Even when tackiness (stick) remains on the surface of the photosensitive solder resist layer 10 formed by coating and then drying, since the light-transparency protecting film 11 is laminated on the surface of the photosensitive solder resist layer 10, the photosensitive solder resist layer 10 can be prevented from being stuck to the surface of the narrow stiffener sheet 7 or the elongate base material 1 rolled up on the take-up roll 22. Besides, since the photosensitive solder resist layer 10 can be well exposed to light through the light-transparency protecting film 11 in the exposure process, the solder resist layer 9 can be formed in the predetermined pattern with accuracy.

EXAMPLE

While in the following, the present invention will be described in further detail with reference to Example and Comparative Example, the present invention is not limited to Example and Comparative Example.

Example 1

A flexible wired circuit board was produced by the roll-to-roll process having the following processes and using the manufacturing equipment.

An elongate base material of a polyimide film having a width of 250 mm and a thickness of 25 μm was prepared (Cf. FIG. 1(a)). Then, a thin metal film comprising a thin chromium film having a thickness of 30 nm and a thin copper film having a thickness of 200 nm was sequentially formed on the entire surface of the elongate base material by the sputtering process (Cf FIG. 1(b)).

Then, at the same time as the adhesive bonding of a photosensitive dry film resist having a thickness of 20 μm to a surface of the thin metal film, a wide stiffener sheet of polyethylene terephthalate film with adhesive having a width of 252 mm and a thickness of 50 μm was adhesively bonded to the back side of the elongate base material. Thereafter, the photosensitive dry film resist was exposed to light and developed, to form a plating resist in a reverse pattern to the conductive pattern (Cf FIG. 1(c)).

Sequentially, a conductive pattern was formed by electrolytic copper plating on an area of the thin metal film exposed from the plating resist (Cf. FIG. 1(d)). This conductive pattern was formed in a fine wired circuit pattern formed by a plurality of lines of wire extending along the longitudinal direction of the elongate base material and spaced in parallel with each other with a predetermined space. The lines of wire were set to be 25 μm in width and 25 μm in the interval between adjacent lines of wire. Also, the conductive pattern had a thickness of 15 μm at both widthwise end portions thereof (at locations 3 mm inwardly from the both widthwise ends thereof) and a thickness of 10 μm at a widthwise central portion thereof.

Thereafter, the plating resist was stripped (Cf FIG. 1(e)). Then, the thin metal film exposed from the conductive pattern was removed by the chemical etching (Cf FIG. 1(f)).

Then, after the wide stiffener sheet was stripped off from the elongate base material, a polyethylene terephthalate film with adhesive (10 μm in thickness) having a width of 240 mm and a thickness of 50 μm, serving as a narrow stiffener sheet, was adhesively bonded to the back side of the elongate base material. The narrow stiffener sheet was adhesively bonded to the elongate base material in such a manner that both widthwise ends thereof are placed 5 mm inwardly from both widthwise ends of the elongate base material (Cf FIG. 1(g)).

Thereafter, varnish of photosensitive solder resist was coated over the elongate base material to form the photosensitive solder resist layer thereon (Cf FIG. 3(a)). It was confirmed in this varnish coating process that the both widthwise end portions of the elongate base material were bent flexibly to escape away from the coater head roll by a pressing force from the varnish coated, then avoiding contacting of the lines of wire formed at the both widthwise ends to have large thickness with the coater head roll.

Then, after the elongate base material on which the photosensitive solder resist layer was coated was dried at 80° C., a light-transparency protecting film of a polyester film having a thickness of 16 μm (that can transmit 87% of the light with wavelengths of 408 nm) was laminated on the front side of the photosensitive solder resist layer on which the tackiness remained (Cf FIG. 3(b)).

In the process of laminating a light-transparency protecting film, the both widthwise end portions of the elongate base material were bent flexibly to escape away from the nip roll on the side that supported the light-transparency protecting film by a pressing force from the light-transparency protecting film laminated, so that the light-transparency protecting film was laminated on the elongate base material with uniform pressure. It was found that this could prevent entry of air bubbles in between the photosensitive solder resist layer and the light-transparency protecting film.

Thereafter, the photosensitive solder resist layer laminating the light-transparency protecting film thereon was exposed to light with wavelength of 365 nm through a photo mask, as shown in FIG. 3(c). Then, the light-transparency protecting film was stripped off (Cf. FIG. 3(d)) and then the photosensitive solder resist layer was developed using 0.7% sodium carbonate solution at 25° C. (Cf FIG. 3(e)).

Then, the photosensitive solder resist layer was cured by heating for 60 minutes at 150° C. to thereby form the solder resist layer in a predetermined pattern in which its portions corresponding to the terminals were opened (Cf FIG. 1(h)).

Thereafter, a nickel plating layer and a gold plating layer were sequentially formed on the portions of the solder resist layer corresponding to the terminals of the conductive pattern by electroless plating. Then, the wired circuit board was trimmed by punching and then the narrow stiffener sheet was stripped off therefrom (Cf FIG. 1(i)). The flexible wired circuit board was produced in the manner described above.

Comparative Example 1

Except that the narrow stiffener sheet was not provided on the elongate base material, the same method as that of Example 1 was conveyed out to obtain a flexible wired circuit board.

It was confirmed in this method that after the formation of the photosensitive solder resist, meandering of the elongate base material occurred when conveyed with the rolls. It was also confirmed that air bubbles entered in between the photosensitive solder resist layer and the light-transparency protecting film at locations 3 mm inwardly from the both widthwise ends of the elongate base material, then causing production of pinholes in the development process of the photosensitive solder resist layer.

While the illustrative embodiments of the present invention are provided in the above description, such is for illustrative purpose only and it is not to be construed restrictively. Modification and variation of the present invention that will be obvious to those skilled in the art is to be covered by the following claims.

What is claimed is:

1. A producing method of a wired circuit board comprising:
   providing an elongate base material;
   forming a conductive pattern on a front surface of the elongate base material by electrolytic plating;
   providing a stiffener sheet having a width that is narrower than a width of the elongate base material;
   placing the stiffener sheet on a back side of the elongate base material opposite to the side where the conductive pattern is formed;
   forming a photosensitive solder resist layer on the front surface of the elongate base material to cover the conductive pattern;
   laminating a light-transparency protecting film on a surface of the photosensitive solder resist layer; and
   exposing the photosensitive solder resist layer to light through the light-transparency protecting film.

2. The producing method of the wired circuit board according to claim 1, wherein the elongate substrate has a thickness of 5-50 μm.

3. The producing method of the wired circuit board according to claim 1, wherein the stiffener sheet has a thickness of 20-200 μm.

4. The producing method of the wired circuit board according to claim 1, further comprising placing the stiffener sheet on the back side of the elongate base material to produce an offset of 1-10 mm per edge.

5. The producing method of the wired circuit board according to claim 1, further comprising removing the stiffener sheet from the back side of the elongate base material.

* * * * *